United States Patent
Midya et al.

(10) Patent No.: US 7,667,552 B2
(45) Date of Patent: Feb. 23, 2010

(54) DISCRETE DITHERED FREQUENCY PULSE WIDTH MODULATION

(75) Inventors: Pallab Midya, Palatine, IL (US); Xin Geng, Urbana, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 106 days.

(21) Appl. No.: 11/733,610

(22) Filed: Apr. 10, 2007

(65) Prior Publication Data
US 2008/0252392 A1 Oct. 16, 2008

(51) Int. Cl.
*H03K 7/00* (2006.01)
(52) U.S. Cl. ........................ 332/106; 332/107; 332/109
(58) Field of Classification Search ......... 332/106–109, 332/117, 123–126
See application file for complete search history.

(56) References Cited

U.S. PATENT DOCUMENTS

| 6,166,873 | A * | 12/2000 | Ichimura et al. ............... 360/65 |
| 6,249,876 | B1 | 6/2001 | Balakrishnan et al. |
| 6,972,534 | B1 | 12/2005 | Schulz et al. |
| 7,116,916 | B2 | 10/2006 | Cochran et al. |
| 7,130,346 | B2 | 10/2006 | Midya et al. |
| 2005/0254573 | A1 | 11/2005 | Midya et al. |
| 2006/0152396 | A1 * | 7/2006 | Wegner et al. ............... 341/143 |
| 2008/0143436 | A1 * | 6/2008 | Xu ............................... 330/10 |

OTHER PUBLICATIONS

J. Balcells, et al., "EMI Reduction in Switched Power Converters Using Frequency Modulation Techniques", IEEE Transactions on Electromagnetic Compatibility, vol. 47, No. 3, Aug. 2005 pp. 569-576.
Kien C. Nguyen, et al., "Up-sampling and Natural Sample Value Computation for Digital Pulse Width Modulators", Mar. 2006, pp. 1096-1011.
Shin Kim, et al., "Adjustable Speed Drive Control Based on Random Pulse Width Modulators", CPES Annual Meeting, Apr. 2000, pp. 202-209.
Deon Jacobs, "Digital Pulse Width Modulation for Class-D Audio Amplifiers", Apr. 2006, pp. 1-209.

* cited by examiner

*Primary Examiner*—Anh Q Tran
(74) *Attorney, Agent, or Firm*—David G. Dolezal

(57) ABSTRACT

A system is described for generating a discrete noise-shaped variable switching frequency signal that may be used to define a digital pulse width modulation ("PWM") period. The system may define a switching frequency waveform that may be used to generate a current switching frequency signal as a function of a system clock. The system may quantize the current switching frequency signal to generate a discrete switching frequency signal that is realizable with the system clock. The system may detect quantization noise and input the noise into the current switching frequency signal to eliminate or reduce discrete tones at the switching frequencies of a PWM signal spectrum.

23 Claims, 9 Drawing Sheets

DISCRETE DITHERED FREQUENCY PULSE WIDTH MODULATION

BACKGROUND

1. Field

This disclosure relates generally to class D audio amplifiers, and more specifically, to a system for generating a discrete noise-shaped variable switching frequency signal.

2. Related Art

In class D audio amplifiers, digital pulse width modulation ("PWM") may be used to convert a digital signal into a series of pulses based on a switching frequency. The switching frequency may be quantized by a high frequency system clock. In conventional PWM, the switching frequency is fixed, which produces discrete tones in the signal spectrum located at the switching frequency and its harmonics. These discrete tones are undesirable since they may produce electromagnetic interference ("EMI"). In communication applications, the discrete tones may exceed EMI regulations. In class D audio amplifier applications, the discrete tones are more harmful than broadband noise since human perception is more sensitive to discrete tones.

Various methods have been used to eliminate or reduce EMI. For example, low pass filters have been used to eliminate EMI; however, low pass filters may require additional board space and expense. Frequency dithering has also been used to reduce EMI; however, frequency dithering is more suitable for analog PWM, since the switching frequency can be varied in a continuous fashion. In digital PWM, the switching frequency is based on counting the system clock; therefore, by definition, the possible switching frequencies are discrete and tonal. Moreover, in class D audio amplifier applications, the high frequency system clock may be generated from a high accuracy low noise crystal reference, and performing frequency dithering on the reference clock may produce noise in the audio band.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The disclosed embodiments provide a system for generating a discrete noise-shaped variable switching frequency signal, referred to herein as a "discrete switching frequency signal." The discrete switching frequency signal may be used to define the period of a digital pulse width modulation ("PWM") generator, such as used in a class D amplifier. As will be described below, the signal content output by the class D amplifier may contain no or limited discrete tones at the switching frequency or its harmonics. Instead, the output signal may comprise a continuous and substantially flat spectrum over the switching frequency band. Electromagnetic interference ("EMI") within the output signal may be eliminated or minimized. The output signal spectrum may also be programmable to fit a wide range of applications, including high-end digital audio amplifiers, cellular telephones, and other applications utilizing digital PWM technology.

The system may define a continuously variable switching frequency waveform that is pre-determined to generate a desired digital PWM signal spectrum. As will be described below, this switching frequency waveform may be generated as a function of a linear periodic function, a nonlinear function, or combinations thereof. Each switching frequency sample on the switching frequency waveform may not be realizable with a fixed frequency system clock. The system may identify a current switching frequency sample on the switching frequency waveform as a function of the system clock. The system may quantize the current sample to one of a pre-determined number of quantization levels. The system may also detect the amount of quantization noise generated as a result of the quantizing and add the quantization noise to a switching frequency sample identified at a subsequent clock cycle. The system may output a noise-shaped switching frequency sample that may be used to define a digital PWM period.

Figure 1:
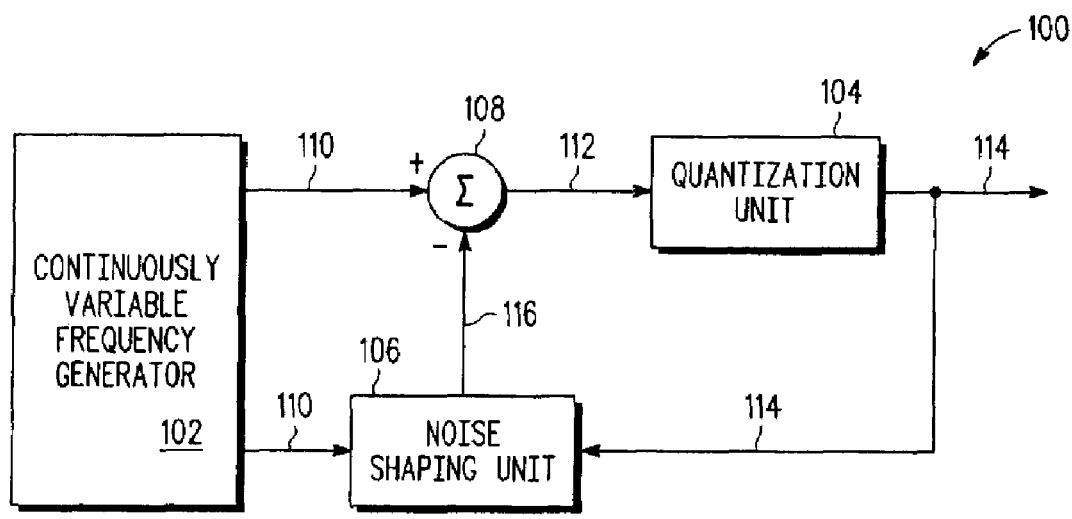
FIG. 1 is a block diagram of an exemplary system for generating a discrete noise-shaped variable switching frequency signal.

One embodiment of a system for generating a discrete noise-shaped variable switching frequency signal is shown in FIG. 1. As shown, the system 100 includes a continuously variable frequency generator 102, a quantization unit 104, a noise shaping unit 106, and a summer 108. The continuously variable frequency generator 102 is coupled with the summer 108 and the noise shaping unit 106, the summer 108 is coupled with the quantization unit 104, and the quantization unit 104 is coupled with the noise shaping unit 106. Herein, the phrase "coupled with" is defined to mean directly connected to or indirectly connected through one or more intermediate components. Such intermediate components may include hardware components, software based components, or both.

The components and/or circuitry described herein may be implemented either in hard-wire circuitry, by software code on a processor or controller, or combinations thereof. The system 100 may be triggered by a clock cycle that may be defined by a rising-edge, falling-edge, half-cycles, or other triggering based on the clock cycle. The clock cycle may be output from a system clock that may be generated by a high accuracy, low noise crystal reference. Additional, different, or fewer components may be provided.

The continuously variable frequency generator 102 may be a signal generator, a function generator, or other frequency generating component that is operable to generate a continuously variable switching frequency waveform. This switching frequency waveform may be pre-determined to produce a desired PWM spectrum, e.g. a PWM spectrum having a continuous and flat spectrum with no or limited discrete tones at the switching frequencies. In one embodiment, the continuously variable frequency generator 102 is programmed to generate a manually defined switching frequency waveform. In another embodiment, the continuously variable frequency generator 102 automatically generates the switching frequency waveform as a function of a look-up table. The look-up table may be stored in an in-memory database, either internal or external to the continuously variable frequency generator 102. The look-up table may contain values such as the starting frequency, the desired switching frequency band including the lowest switching frequency and the highest switching frequency, the rate of sweep of the waveform, the waveform amplitude, and/or other values that may be used to generate and/or define the waveform.

The continuously variable frequency generator 102 may use the values contained within the look-up table, in combination with a system clock, to generate the switching frequency waveform as a function of a linear periodic function, a nonlinear function, or combinations thereof. The linear periodic function may be a triangular function, a saw-tooth function, or other linear periodic function. The nonlinear function may be a polynomial function, a sinusoidal function, or other nonlinear function. For example, if the switching frequency waveform is selected to have a starting frequency of 125 kHz, a desired switching frequency band ranging from 125 kHz to 150 kHz, a sweep rate of 20 Hz, and a given amplitude, in combination with a system clock of 16 MHz, the continuously variable frequency generator 102 may generate the switching frequency waveform 200 shown in FIG. 2. The switching frequency waveform 200 is comprised of a linear combination of a triangle and a quadratic function, although other combinations of linear periodic function(s) and/or nonlinear function(s) may be used. The combination of a linear periodic function and a nonlinear function may produce a more continuous and flat PWM spectrum at the switching frequency than a purely linear periodic function or a purely nonlinear function.

The continuously variable frequency generator 102 may identify a switching frequency sample on the switching frequency waveform as a function of the system clock. This sample corresponds to the current value of the switching frequency waveform at a particular clock cycle. For example, in a first clock cycle, the switching frequency sample may equal 127.5 kHz, in a second clock cycle, the switching frequency sample may equal 126 kHz, in a third clock cycle, the switching frequency sample may equal 125.25 kHz, and so on. The continuously variable frequency generator 102 may output switching frequency samples at every clock cycle, every other clock cycle, every third clock cycle, or at some other time determinable by the system clock. The continuously variable frequency generator 102 may output the current switching frequency sample as a signal 110, referred to herein as the current switching frequency signal 110. Over a range of clock cycles, the current switching frequency signal 110 may represent switching frequency samples that are continuously variable as a function of the switching frequency waveform.

In one embodiment, the current switching frequency signal 110 is a digital representation of the current switching frequency sample. The current switching frequency signal 110 may be represented in as many bits as allowed by a processor used by the system 100. The current switching frequency signal 110 may be as accurate as possible and contain no granularity with respect to the number of bits available. In one embodiment, the system 100 uses a 24-bit processor and the current switching frequency signal 110 is at 24-bit accuracy. In another embodiment, the system 100 uses a 48-bit processor and the current switching frequency signal 110 is at 48-bit accuracy. Other processors and signal accuracies may be used by the system 100. In another embodiment, the current switching frequency signal 110 may contain granularity with respect to the processor, e.g. the system 100 may use a 24-bit processor and the current switching frequency signal 110 may be at 20-bit accuracy, depending on the application in which the system 100 is implemented.

The quantization unit 104 is a digital logic block or other component operable to quantize a digital signal. Upon initialization of the system 100, e.g. power-up, restart, reboot, reset, or other initializations, no quantization noise generated from a previous clock cycle will be available to the system 100. As a result, the quantization unit 104 may quantize the current switching frequency signal 110 without correction of noise. As will be described below, when quantization noise is detected by the noise shaping unit 106 and added to the current switching frequency signal 110, the quantization unit 104 may quantize a corrected switching frequency signal 112. Hereinafter, for explanation purposes, the quantization unit 104 will be described as quantizing the corrected switching frequency signal 112 after initialization.

The quantization unit 104 quantizes the corrected switching frequency signal 112 to a set of discrete values, i.e. quantization levels, determined as a function of the fixed frequency system clock, and outputs a discrete switching frequency signal 114. The discrete switching frequency signal 114 is thereby limited to one of the quantization levels utilized by the quantization unit 104. Each quantization level represents a discrete switching frequency that may be used to define the digital PWM period. Because the quantization levels are discrete and limited to frequencies realizable by the system clock, the discrete switching frequency signal 114 may be represented by a lesser number of bits than the current switching frequency signal 110. For example, the discrete switching frequency signal 114 may be a 7-bit number representing the particular quantization levels utilized by the quantization unit 104, although a greater or lesser number of bits, e.g. 8-bits, 6-bits, or other number of bits, may be used by the system 100.

Figure 2:
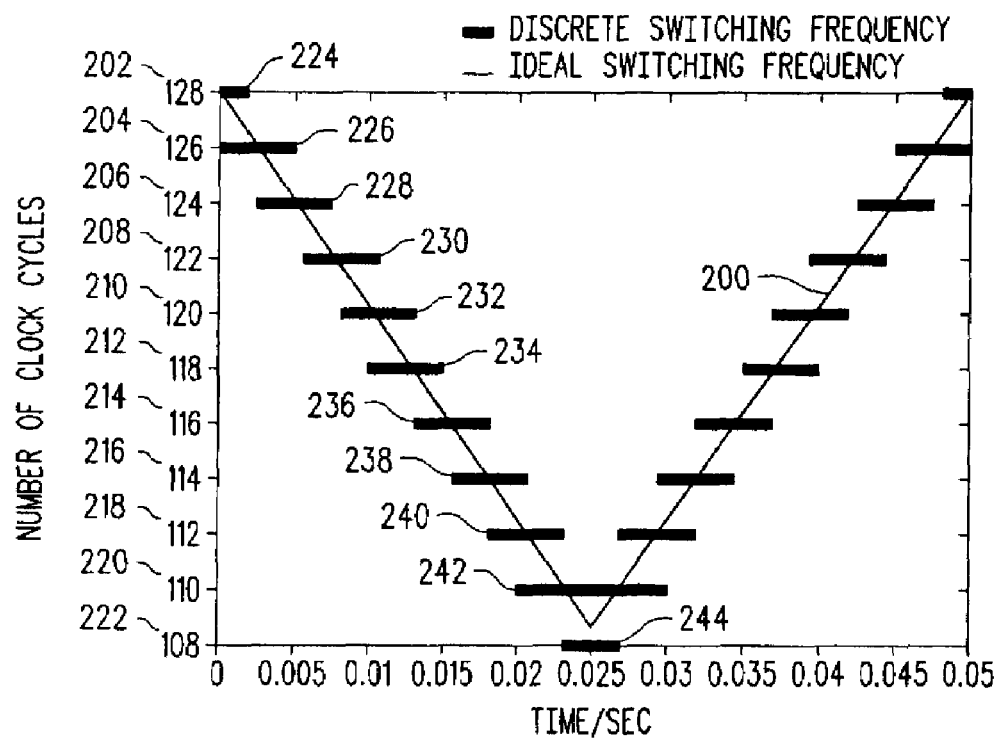
FIG. 2 is a graph of exemplary discrete switching frequencies plotted against a switching frequency waveform generated by the system of FIG. 1 according to one embodiment.

The quantization unit 104 may utilize two or more predetermined quantization levels to quantize the corrected switching frequency signal 112. For example, in FIG. 2, the quantization unit 104 utilizes eleven quantization levels 202-222. The quantization levels 202-222 are defined by the even number of clock cycles ranging from 128 to 108 that is required to sweep the switching frequency waveform 200. In FIG. 2, exemplary discrete switching frequencies 224-244 are shown plotted against the switching frequency waveform 200. Assuming a 16 MHz system clock, if the quantization unit 104 quantizes the corrected switching frequency signal 112 to quantization level 202, which corresponds to a switching frequency of 125 kHz, the digital PWM period will be 128 clock cycles in length, or 8 microseconds.

Figure 3:
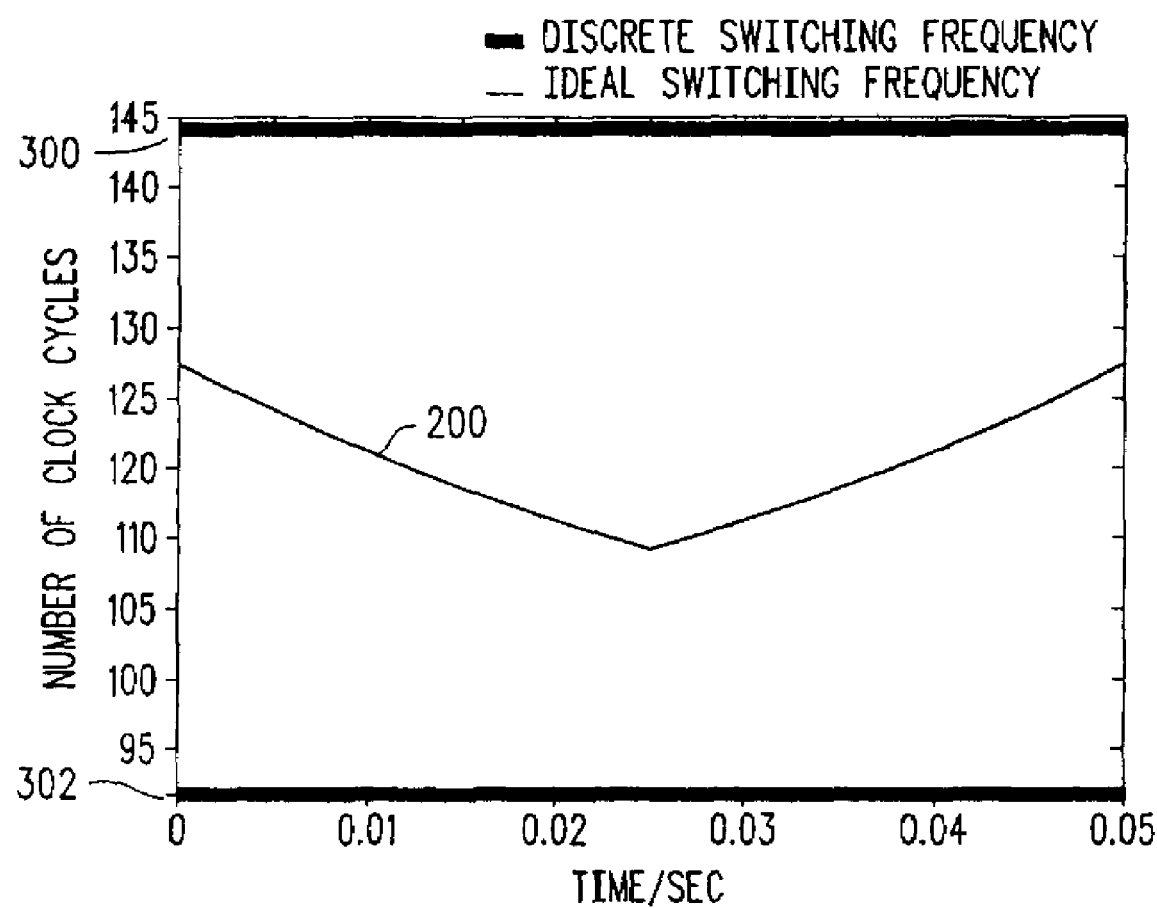
FIG. 3 is a graph of two exemplary discrete switching frequencies plotted against a switching frequency waveform generated by the system of FIG. 1 according to one embodiment.

In the example of FIG. 3, the quantization unit 104 utilizes only two quantization levels 300, 302. The quantization levels 300, 302 are defined by the even number clock cycles 144 and 92. The switching frequency waveform 200 is within the boundary of the quantization levels 300, 302. In one embodiment, the discrete switching frequency signal 114 is represented by two 7-bit numbers corresponding to the two quantization levels 300, 302. In another embodiment, the discrete switching frequency signal 114 is represented by two signal binary numbers, where '1' represents quantization level 300 and '0' represents quantization level 302. Using only two quantization levels may simply the implementation of the system 100.

The noise shaping unit 106 is a module or circuit that is operable to determine the quantization error produced by the quantization unit 104 as a function of the current switching frequency signal 110 and the discrete switching frequency signal 114 in a given clock cycle. The quantization error generates quantization noise in the system 100, which may increase in proportion to the difference between the two signals 110, 114. As a result, for higher quality applications, the number of quantization levels may be increased to reduce quantization noise. The noise shaping unit 106 receives as inputs the current switching frequency signal 110 and the discrete switching frequency signal 114, and compares the two signals to determine the amount of quantization noise produced by the quantization unit 104. The noise shaping unit 106 may store the quantization noise until a future clock cycle, e.g. the immediate subsequent clock cycle, and provide the quantization noise, represented by quantization noise signal 116, to the summer 108.

The summer 108 is a module, node, or circuit that is operable to perform a summation operation as a function of the current switching frequency signal 110 and the quantization noise signal 116. The summer 108 adds the quantization noise represented by the quantization noise signal 116 to the current switching frequency signal 110 to generate the corrected switching frequency signal 112. The corrected switching frequency signal 112 is input to the quantization unit 104 for quantization.

By adding the quantization noise to the current switching frequency signal 110, the system 100 may eliminate or reduce the discrete tones that would otherwise appear at the switching frequencies of the PWM signal spectrum. Looking at FIG. 2, as a function of the system clock, the current switching frequency signal 110 represents switching frequency samples that are derived from the switching frequency waveform 200. The quantization unit 104 outputs discrete switching frequency signals 114 as a function of the available quantization levels. Without noise shaping, the quantization unit 104 may output a discrete switching frequency signal 114 corresponding to quantization level 202 for an amount of time, a discrete switching frequency signal 114 corresponding to quantization level 204 for an amount of time, a discrete switching frequency signal 114 corresponding to quantization level 206 for an amount of time, and so on, which would result in a "stair stepped" waveform output over the range of clock cycles. Such a "stair stepped" waveform may produce discrete tones located at the switching frequencies.

In the alternative, the noise shaping unit 106 may determine and add the quantization noise to the current switching frequency signal 110 at each clock cycle. In one embodiment, the quantization unit 104 outputs a discrete switching frequency signal 114 that oscillates between quantization levels 202 and 204 for an amount of time, then oscillates between quantization levels 204 and 206 for an amount of time, then oscillates between 206 and 208 for an amount, and so on. The discrete switching frequency signal 114 may also oscillate between every second or third quantization levels depending on the number of quantization levels utilized by the quantization unit 104 and/or the amount of quantization noise detected by the noise shaping unit 106. The resultant oscillation may "smooth out" the "stair stepped" waveform and thereby eliminate or reduce the discrete tones that may otherwise appear at the discrete switching frequencies.

Figure 4:
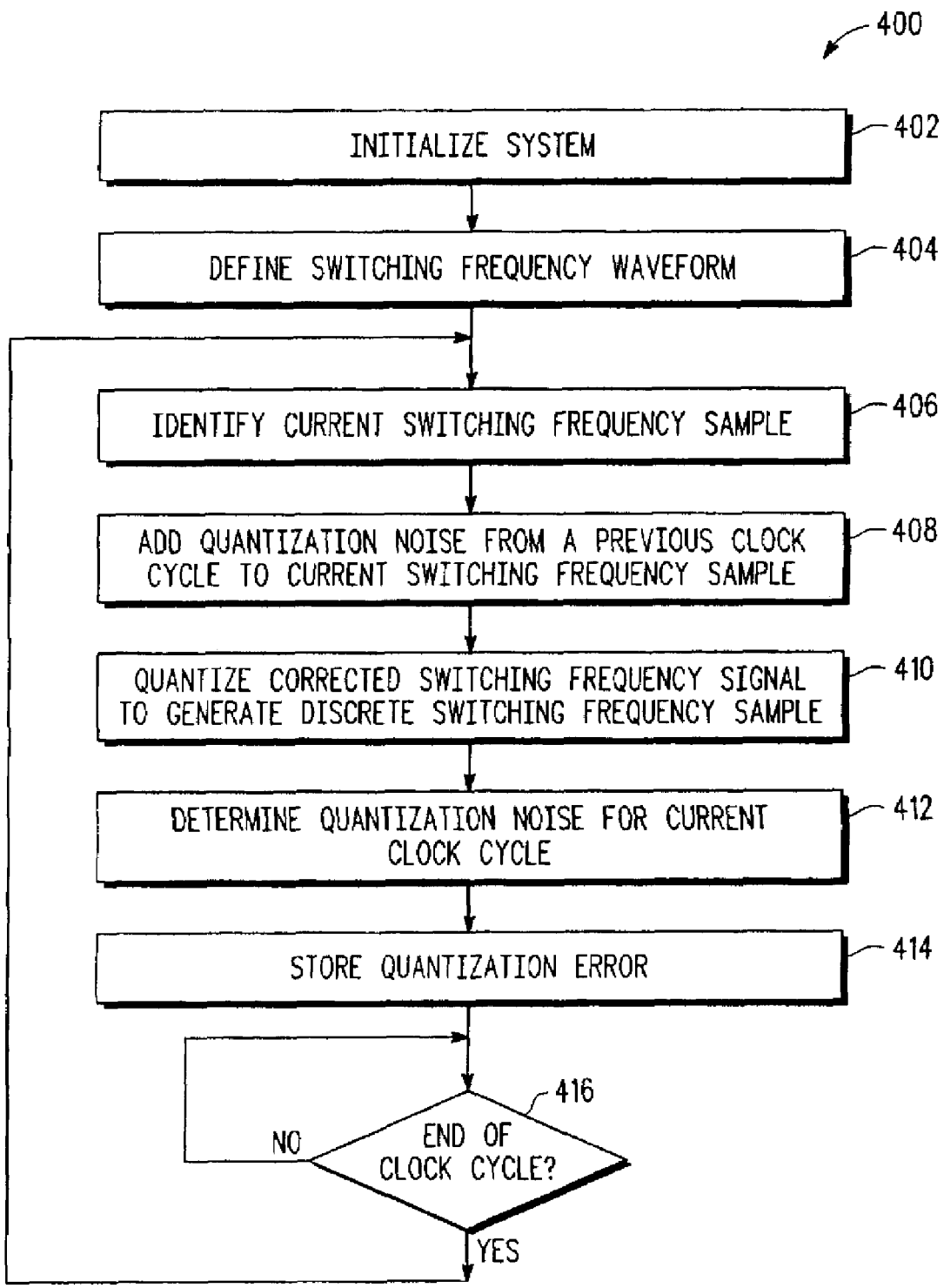
FIG. 4 is a flow chart of one example of generating a discrete noise-shaped variable switching frequency signal.

A flow diagram illustrating an exemplary process 400 according to one embodiment is shown in FIG. 4. The process 400 may be implemented for use with the system 100 of FIG. 1, or a different system. The process 400 begins with the initialization of the system, e.g. power-up, restart, reboot, reset, or other initializations, represented by block 402. The process 400 proceeds to block 404 where the pre-determined switching frequency waveform is defined. The process 400 proceeds to block 406 where the current switching frequency sample is identified as a function of the switching frequency waveform and the system clock. The process 400 proceeds to block 408 where the quantization noise, if any, detected from a previous clock cycle is added to the current switching frequency sample. The process 400 proceeds to block 410 where the corrected switching frequency sample is quantized to generate the discrete switching frequency sample.

The process 400 proceeds to block 412 where the quantization noise is determined for the current clock cycle as a function of a comparison between the current switching frequency sample and the discrete switching frequency sample. The process 400 proceeds to block 414 where the quantization noise is stored and made available to be added back into the system 100 at a future clock cycle, e.g. the immediate subsequent clock cycle. The process 400 proceeds to decision block 416 where it is determined if the clock cycle has ended. If no, the process 400 loops back to decision block 416. If yes, the process 400 loops back to block 406 where the current switching frequency signal 110 is identified in a subsequent clock cycle. In one embodiment, the process 400 performs the steps comprised within blocks 402 to 416 in a signal clock cycle, although these steps may be performed in multiple clock cycles. The process 400 may add the stored quantization noise detected from the clock cycle to the current switching frequency sample identified in the immediate subsequent clock cycle, or at some other time.

Figure 5:
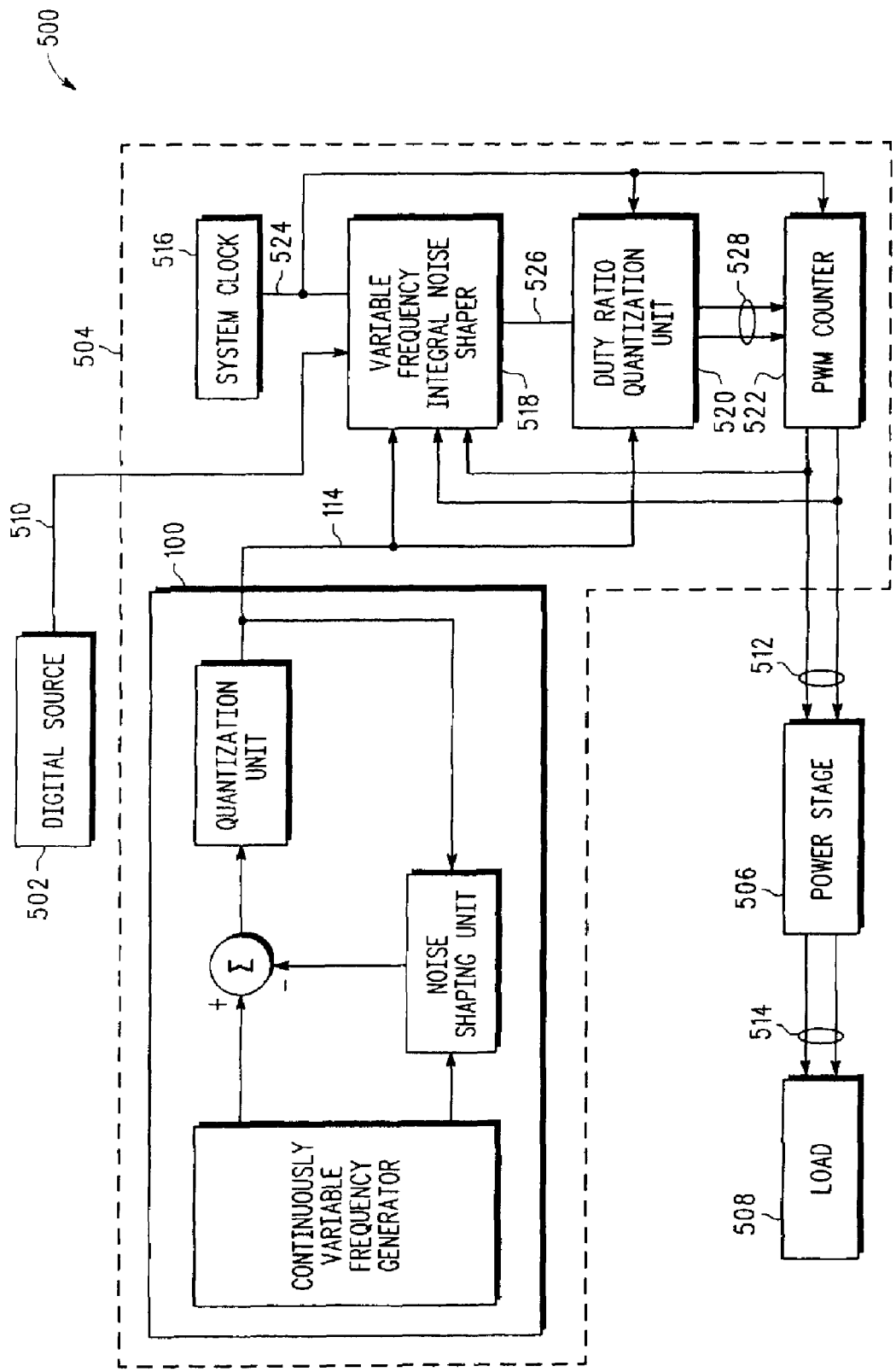
FIG. 5 is a block diagram of an exemplary class D amplifier incorporating an exemplary system for generating a discrete noise-shaped variable switching frequency signal.

A class D amplifier 500 incorporating one embodiment is shown in FIG. 5. The class D amplifier may include a digital source 502, a digital PWM signal generator 504 coupled with the digital source 502, a power stage 506 coupled with the digital PWM signal generator 504, and a load 508 coupled with the power stage 506. The digital source 504 may include a compact disc ("CD") player, digital video disc ("DVD") player, digital audio tape player, cellular telephone, digital car radio, or other digital sources. The digital source 504 may provide a digital signal 510 in the form of, for example, a pulse code modulated ("PCM") signal or a pulse density modulated ("PDM") signal, to the digital PWM signal generator 504. The digital PWM signal generator 504 is a module that includes one embodiment of the present invention and is operable to generate and output PWM signals 512 as a function of the PWM periods generated by the system 100. The power stage 506 is operable to amplify the PWM signals 512. The power stage 506 may provide the amplified PWM signals 514 to the load 508. In one embodiment, the load 508 is an audio speaker, although other embodiments of the class D amplifier 500 may use other types of loads.

In the example of FIG. 5, the digital PWM signal generator 504 includes a system clock 516, a PWM period generator 100, i.e. one embodiment of the system 100, a variable frequency integral noise shaper 518, a duty ratio quantization unit 520, and a PWM counter 522. A similar digital PWM signal generator 504 is described in commonly assigned U.S. Pat. No. 7,130,346, filed on May 14, 2004, entitled "Method and Apparatus Having a Digital PWM Signal Generator with Integral Noise Shaping," which is incorporated herein by reference. However, the random period generator described in U.S. Pat. No. 7,130,346 is replaced with the PWM period generator 100 described herein. It will be appreciated that the system 100 may be implemented with any digital PWM signal generator found in any class D amplifier or other module operable to perform digital PWM.

In operation, the variable frequency integral noise shaper 516 receives as input the digital signal 510, the discrete switching frequency signal 114, a system clock signal 524, and the PWM signals 512. The variable frequency integral noise shaper 518 generates an unquantized duty ratio, represented by unquantized duty ratio signal 526. The variable frequency integral noise shaper 518 takes the integral of the difference between the digital signal 510 and the discrete switching frequency signal 114 in a particular clock cycle. In one embodiment, the integrals are computed in closed-form in the digital domain to generate the unquantized duty ratio signal 526. The unquantized duty ratio signal 526 is generated such that the PWM signals 512 may mirror the signal content of the digital input 510 within the audio band.

The duty ratio quantization unit 520 receives as input the unquantized duty ratio signal 526, the discrete switching frequency signal 114, and the system clock signal 524. The duty ratio quantization unit 520 quantizes the unquantized duty ratio signal 526 to some smaller number of bits such that the duty ratio signal 526 can be realizable with the fixed frequency system clock 516. The duty ratio quantization unit 520 outputs a quantized duty ratio, represented by quantized duty ratio signals 528. The PWM counter 522 receives as input the quantized duty ratio signals 528 and the system clock signal 524 and outputs the PWM signals 512. In one embodiment, the PWM counter 522 is a 7-bit counter, although other counters may be used. The power stage 506 receives as inputs the PWM signals 512 and outputs the amplified PWM signals 514 to the load 508.

Figure 6:
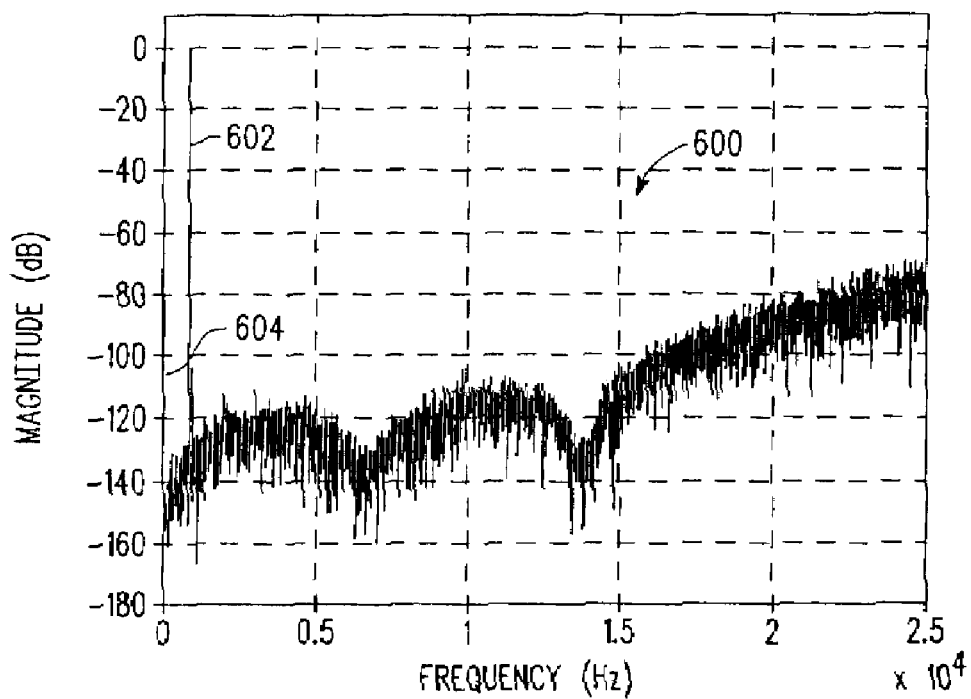
FIG. 6 is a graph of a differential output up to a frequency of 25 kHz of a class D amplifier incorporating an exemplary system for generating a discrete noise-shaped variable switching frequency signal, using the discrete switching frequencies shown in FIG. 2.
Figure 7:
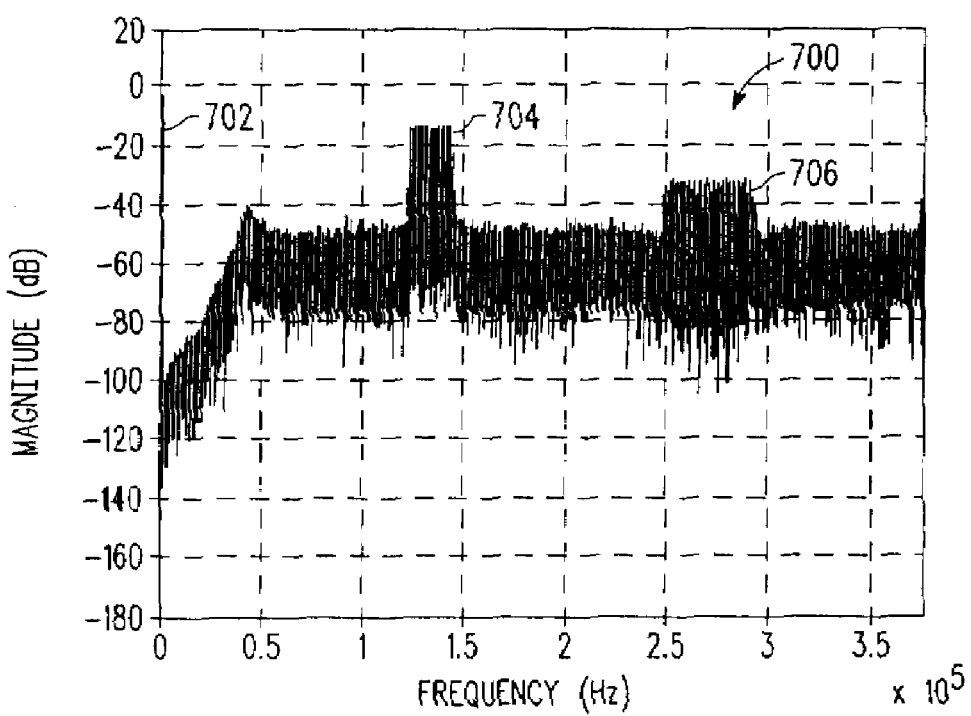
FIG. 7 is a graph of a single-ended output up to a frequency of 375 kHz of a class D amplifier incorporating an exemplary system for generating a discrete noise-shaped variable switching frequency signal, using the discrete switching frequencies shown in FIG. 2.
Figure 8:
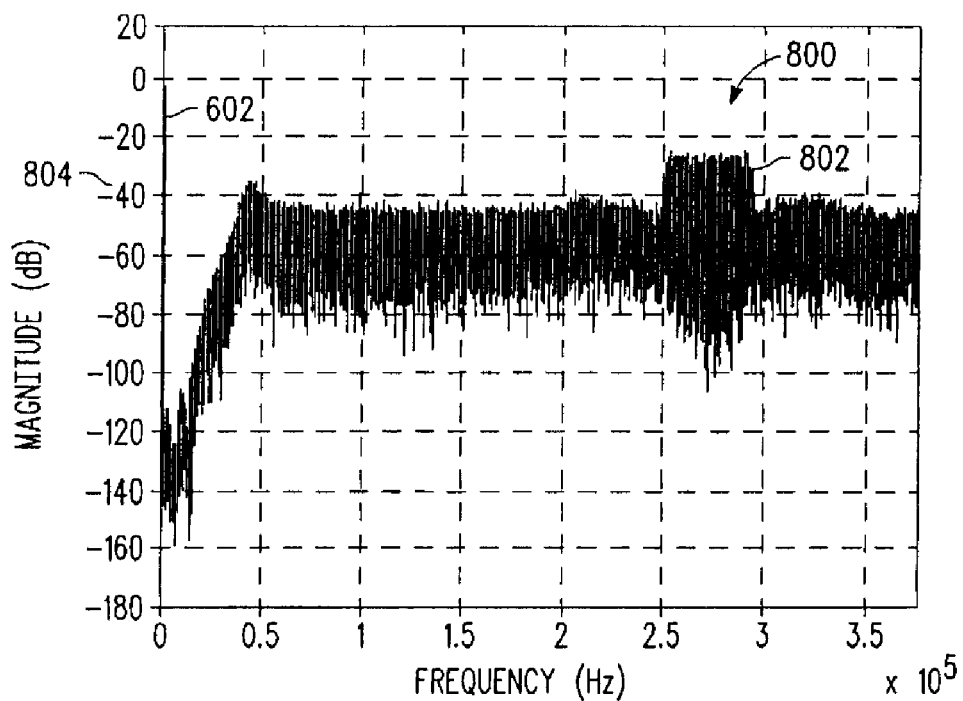
FIG. 8 is a graph of the differential output shown in FIG. 6 up to a frequency of 375 kHz.

FIG. 6 provides a PWM signal spectrum 600 up to a frequency of 25 kHz measured across the load 508, using the discrete switching frequency signal 114 generated as a function of the eleven quantization levels 202-222 shown in example of FIG. 2. The spectrum 600 includes a tone 602 at 1 kHz representing the desired signal content, which is normalized to approximately 0 dB. The noise floor 604 is optimized up to approximately 15 kHz and is approximately 110 dB lower than the desired tone 602. FIG. 7 provides a PWM signal spectrum 700 up to a frequency of 375 kHz measured at one of the pair of PWM signals 512. The desired tone 702 can be seen at 1 kHz. The spectrum 700 shows the switching frequency band 704 ranging from 125 kHz to ~148 kHz produced as a function of the switching frequency waveform 200 shown in the example of FIG. 2. The switching frequency band 704 can be seen as a rectangle-shaped box that is continuous and substantially flat across the band 704. The band 704 contains no or limited discrete tones and is below 0 dB thus reducing EMI. A harmonic switching frequency band 706 can also be seen with a continuous and substantially flat spectrum across the band 706 and containing no or limited discrete tones. FIG. 8 shows the PWM signal spectrum 600 up to a frequency of 375 kHz, represented as spectrum 800. The desired tone 602 can be seen at 1 kHz. An optimal case is shown where the switching frequency band has been cancelled out leaving only a harmonic switching frequency band 802 having a relatively continuous and substantially flat spectrum with no or limited discrete tones. The spectrum 800 shows a low noise floor 804 compared to the desired tone 602.

Figure 9:
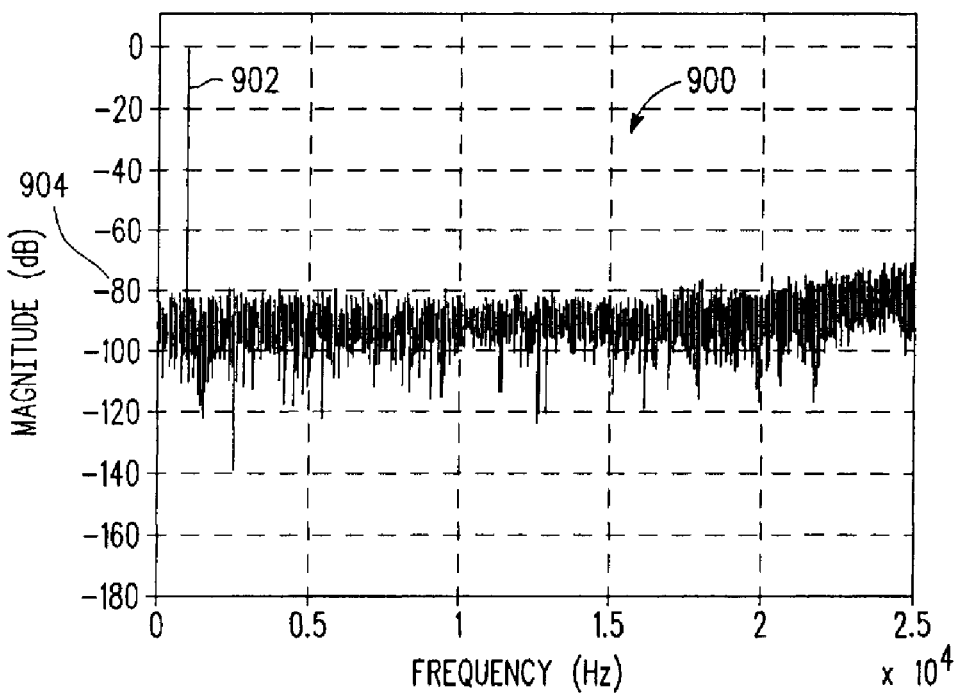
FIG. 9 is a graph of a differential output up to a frequency of 25 kHz of a class D amplifier incorporating an exemplary system for generating a discrete noise-shaped variable switching frequency signal, using the discrete switching frequencies shown in FIG. 3.
Figure 10:
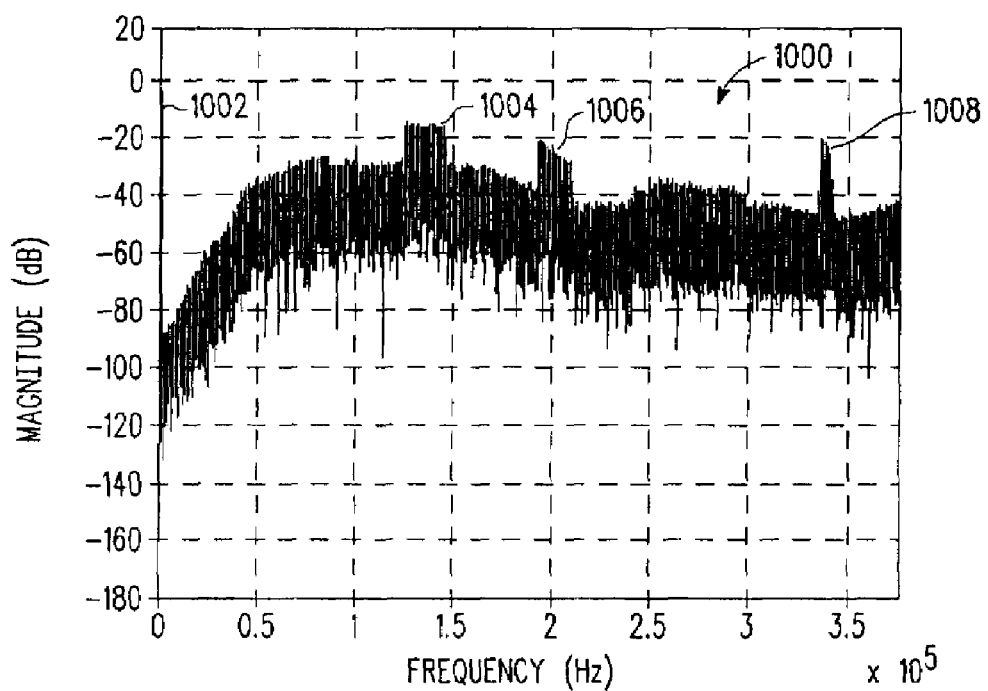
FIG. 10 is a graph of a single-ended output up to a frequency of 375 kHz of a class D amplifier incorporating an exemplary system for generating a discrete noise-shaped variable switching frequency signal, using the discrete switching frequencies shown in FIG. 3.
Figure 11:
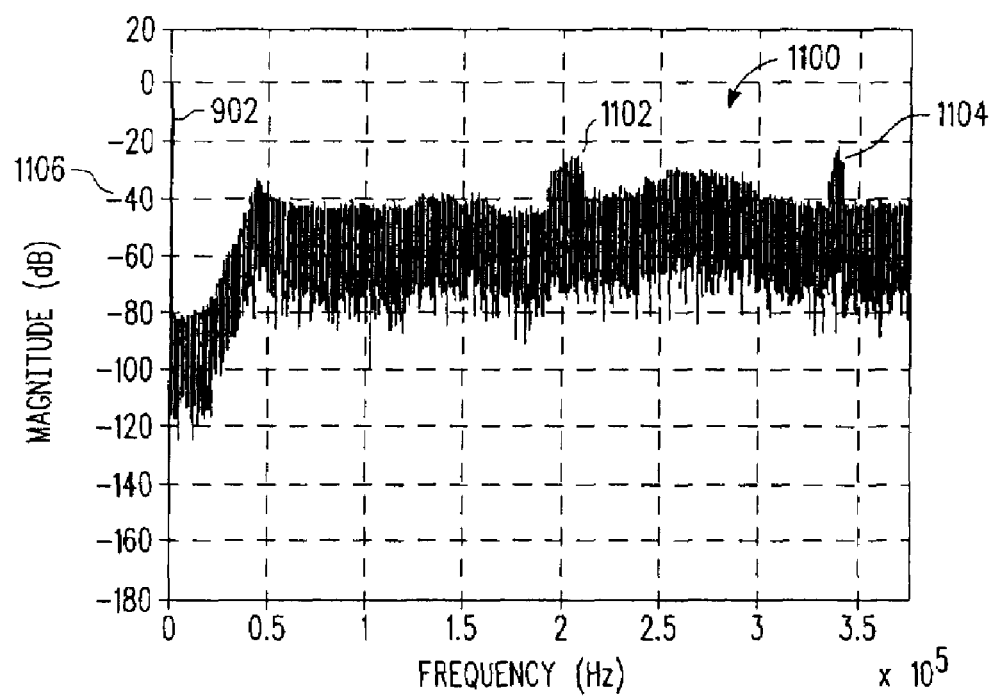
FIG. 11 is a graph of the differential output shown in FIG. 9 up to a frequency of 375 kHz.

FIG. 9 provides a PWM signal spectrum 900 up to a frequency of 25 kHz measured across the load 508, using the discrete switching frequency signal 114 generated as a function of the two quantization levels 300, 302 shown in FIG. 3. The spectrum 900 includes a tone 902 at 1 kHz representing the desired signal content, which is normalized to approximately 0 dB. The noise floor 904 is approximately 80 dB lower than the desired tone 902. FIG. 10 provides a PWM signal spectrum 1000 up to a frequency of 375 kHz measured at one of the pair of PWM signals 512. The desired tone 1002 can be seen at 1 kHz. The spectrum 1000 shows a switching frequency band 1004 ranging from 125 kHz to ~148 kHz produced as a function of the switching frequency waveform 200. The switching frequency band 1004 can be seen as a rectangle-shaped box that is continuous and substantially flat across the band 1004. The band 1004 contains no or limited discrete tones and is below 0 dB thus reducing EMI. Harmonic switching frequency bands 1006 and 1008 can also be seen at approximately 200 kHz and 340 kHz, respectively. FIG. 1100 shows the PWM signal spectrum 900 up to a frequency of 375 kHz, represented as spectrum 1100. The desired tone 902 can be seen at 1 kHz. The switching frequency band has been cancelled out leaving only harmonics 1102 and 1104. The spectrum 1100 shows a low noise floor 1106 compared to the desired tone 902.

Figure 12:
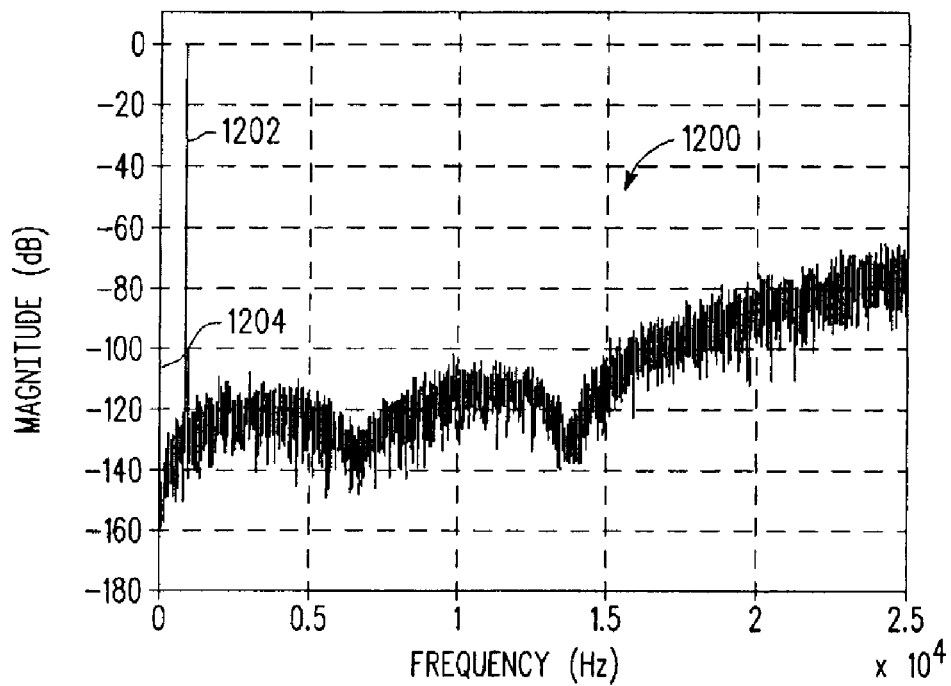
FIG. 12 is a graph of a differential output up to a frequency of 25 kHz of a class D amplifier incorporating a conventional fixed PWM period generator.

FIG. 12 provides a PWM signal spectrum 1200 up to a frequency of 25 kHz measured across the load 508, assuming the digital PWM signal generator 504 utilizes a conventional fixed PWM period generator rather than the variable PWM period generator 100 described herein. The spectrum 1200 assumes similar parameters as the previous spectrums, i.e. a system clock of 16 MHz and a desired tone 1202 at 1 kHz. The fixed switching frequency is at 125 kHz. The spectrum 1200 has a similar noise floor 1204 within the audio band as spectrum 600. A comparison of FIGS. 6 and 12 demonstrates that the same or similar audio response may be attained by the discrete switching frequency signal 114 generated by the system 100, as with conventional fixed switching frequency methods.

Figure 13:
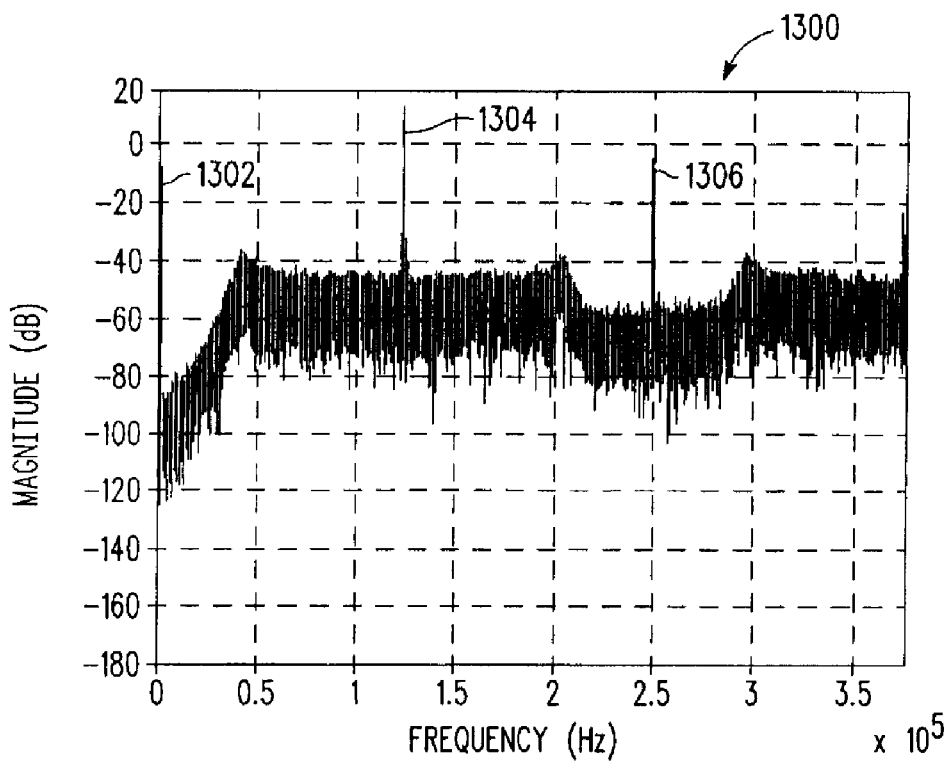
FIG. 13 is a graph of a single-ended output up to a frequency of 375 kHz of a class D amplifier incorporating a conventional fixed PWM period generator.

FIG. 13 provides a PWM signal spectrum 1300 up to a frequency of 375 kHz measured at one of the pair of PWM signals 512, assuming a conventional fixed PWM period generator. The desired tone 1302 can be seen at 1 kHz. The spectrum 1300 shows a discrete tone 1304 at the switching frequency of 125 kHz. The discrete tone 1304 is above 0 dB and may interfere with nearby communication equipment, e.g. AM radios. The discrete tone 1304 may also exceed EMI regulations for a particular application and/or a particular frequency range. By comparison, the spectrum 700 contains little or no discrete tones, but rather shapes the switching frequency signal energy in a continuous and substantially flat, rectangle-shaped switching frequency band 704. The switching frequency band 704 has a 30 dB attenuation as compared to the discrete tone 1304, which may meet EMI regulations and may also allow for the elimination of the low pass filter at the power stage 506. The spectrum 1300 also shows a discrete tone 1306 at the switching frequency harmonic.

Figure 14:
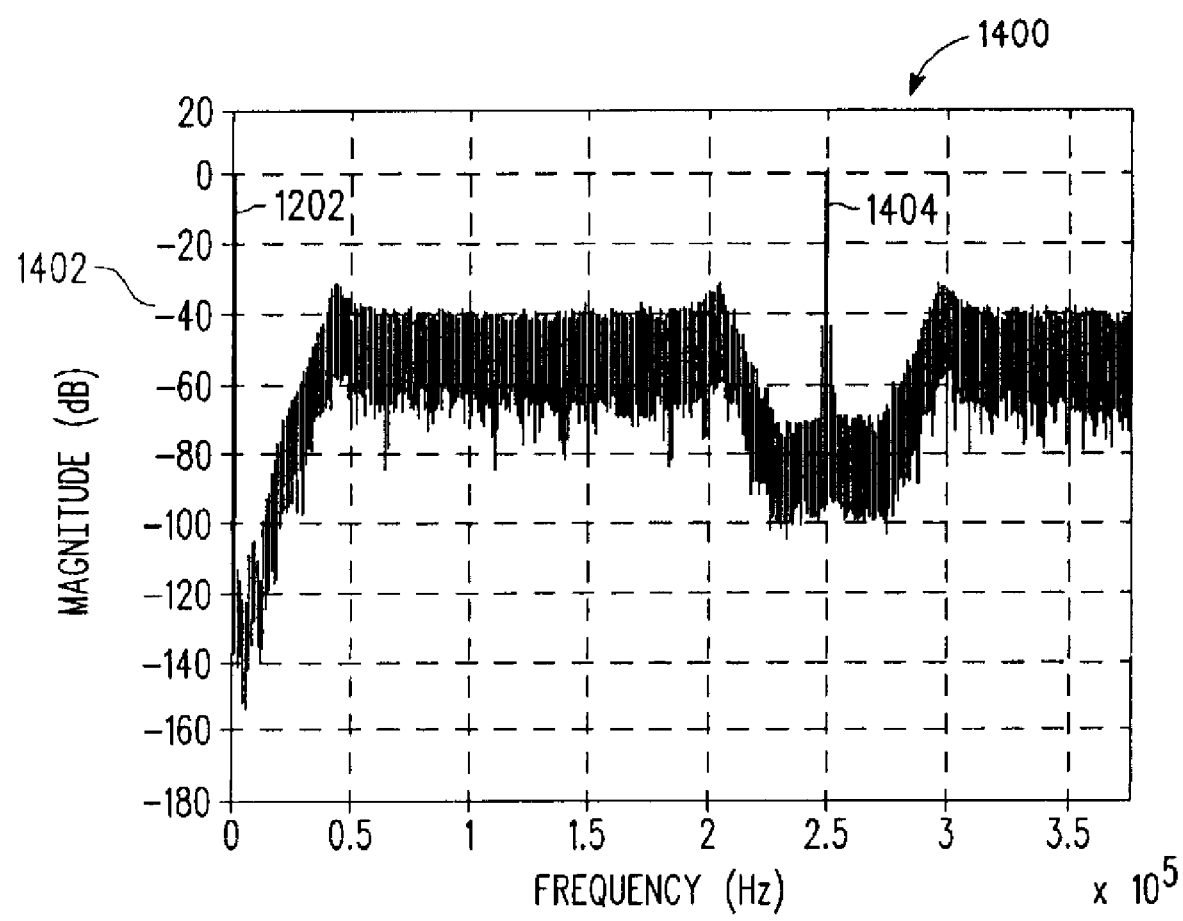
FIG. 14 is a graph of the differential output shown in FIG. 12 up to a frequency of 375 kHz.

FIG. 14 shows the PWM signal spectrum 1200 up to a frequency of 375 kHz, represented as spectrum 1400. The desired tone 1202 can be seen at 1 kHz. By comparison, the spectrum 800 has a similar noise floor 806 in the audio band as the noise floor 1402 shown in FIG. 14. Moreover, rather than a discrete tone 1404 at the switching frequency harmonic, the spectrum 800 has a harmonic switching frequency band 804 having a relatively continuous and substantially flat spectrum with no or limited discrete tones.

The PWM periods generated by the system 100 may be used across multiple channel outputs, e.g. a class D amplifier including five channels of PWM output signals. The discrete switching frequency signal 114 may be used to synchronize the multiple channels of output. The synchronization may eliminate or reduce EMI that exists across the channels. The synchronization may also include having a phase-off between the channels. The pre-determined switching frequency bands may also be programmable to produce a desired switching frequency band and/or EMI. For example, the amplitude of the switching frequency waveform may be increased to widen the resultant switching frequency band, which may have the effect of spreading the switching frequency signal energy over a broader range and decreasing EMI. Alternatively, the amplitude of the switching frequency waveform may be decreased to shorten the resultant switching frequency band, which may have the effect of focusing the switching frequency signal energy over a smaller range and increasing EMI.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for generating a discrete switching frequency sample, the method comprising:
   identifying a current switching frequency sample;
   noise shaping the current switching frequency sample as a function of a quantization error;
   quantizing the noise-shaped current switching frequency sample; and
   generating a discrete switching frequency sample as a function of the quantizing;
   using the discrete switching frequency sample to define a digital pulse width modulation ("PWM") period.

2. The method of claim 1 further comprising:
   defining a switching frequency waveform, wherein the current switching frequency sample is identified as a function of the switching frequency waveform.

3. The method of claim 2 wherein the switching frequency waveform comprises a linear periodic function, a nonlinear function, or combinations thereof.

4. The method of claim 1 wherein the quantization error is determined as a function of a comparison of the current switching frequency sample and the discrete switching frequency sample.

5. The method of claim 1 further comprising:
   storing the quantization error for at least one clock cycle.

6. The method of claim 1 wherein the quantizing comprises:
   quantizing the noise-shaped current switching frequency sample as a function of at least two quantization levels.

7. The method of claim 1 wherein the discrete switching frequency sample is received by a digital amplifier, wherein the using step is performed by the digital amplifier.

8. An apparatus for generating a discrete switching frequency signal, the apparatus comprising:
   a continuously variable frequency generator operable to provide a current switching frequency signal as a function of a system clock;
   a noise shaping unit operable to noise shape the current switching frequency signal as a function of a quantization error; and
   a quantization unit operable to quantize the noise shaped current switching frequency signal to generate a discrete switching frequency signal.

9. The apparatus of claim 8 wherein the continuously variable frequency generator is further operable to define a switching frequency waveform, and wherein the current switching frequency signal is generated as a function of the switching frequency waveform.

10. The apparatus of claim 9 wherein the switching frequency waveform comprises a linear periodic function, a nonlinear function, or combinations thereof.

11. The apparatus of claim 9 wherein the switching frequency waveform is programmable to produce a pre-determined digital PWM signal spectrum.

12. The apparatus of claim 8 wherein the noise shaping unit is further operable to detect the quantization error as a function of the current switching frequency signal and the discrete switching frequency signal.

13. The apparatus of claim 8 further comprising a summer operable to receive the quantization error from the noise shaping unit and add the quantization error to the current switching frequency signal.

14. The apparatus of claim 8 wherein the quantization unit is operable to quantize the noise shaped current switching frequency signal as a function of at least two quantization levels.

15. A system for generating a digital pulse width modulation ("PWM") output signal, the system comprising:
   a PWM period generator operable to generate a variable PWM period signal as a function of a pre-determined switching frequency waveform; and
   a PWM signal generator operable to generate a PWM output signal as a function of the variable PWM period signal, wherein the variable PWM period signal is used to define a switching frequency of the PWM signal generator, wherein the switching frequency varies during operation;
   wherein the variable PWM period signal is noise-shaped as a function of a quantization error.

16. The system of claim 15 wherein the pre-determined switching frequency waveform comprises a linear periodic function, a nonlinear function, or combinations thereof.

17. A system for generating a digital pulse width modulation ("PWM") output signal, the system comprising:

a PWM period generator operable to generate a variable PWM period signal as a function of a pre-determined switching frequency waveform; and a PWM signal generator operable to generate a PWM output signal as a function of the variable PWM period signal;

wherein the PWM signal generator comprises:

an integral noise shaper operable to generate a duty ratio signal as a function of the variable PWM period signal;

a duty ratio quantization unit operable to quantize the duty ratio signal; and a PWM counter operable to generate the PWM output signal as a function of the quantized duty ratio signal.

18. The system of claim 15 wherein the PWM output signal comprises no or limited discrete tones at the switching frequency.

19. The system of claim 17 wherein the variable PWM period signal is noise-shaped as a function of a quantization error.

20. A system for generating a digital pulse width modulation ("PWM") output signal, the system comprising:

a PWM period generator operable to generate a variable PWM period signal as a function of a pre-determined switching frequency waveform; and a PWM signal generator operable to generate a PWM output signal as a function of the variable PWM period signal;

wherein the PWM period generator comprises:

a continuously variable frequency generator operable to provide a current switching frequency signal as a function of a system clock;

a noise shaping unit operable to noise shape the current switching frequency signal as a function of a quantization error; and a quantization unit operable to quantize the noise shaped current switching frequency signal to generate a discrete switching frequency signal.

21. The method of claim 2 further comprising:

generating the switching frequency waveform as a function of a system clock.

22. A method for generating a discrete switching frequency sample, the method comprising:

identifying a current switching frequency sample;

noise shaping the current switching frequency sample as a function of a quantization error;

quantizing the noise-shaped current switching frequency sample; and generating a discrete switching frequency sample as a function of the quantizing;

storing the quantization error for at least one clock cycle.

23. A method for generating a discrete switching frequency sample, the method comprising:

identifying a current switching frequency sample;

noise shaping the current switching frequency sample as a function of a quantization error;

quantizing the noise-shaped current switching frequency sample;

generating a discrete switching frequency sample as a function of the quantizing;

defining a switching frequency waveform, wherein the current switching frequency sample is identified as a function of the switching frequency waveform;

generating the switching frequency waveform as a function of a system clock.

* * * * *